(12) United States Patent
Mohan et al.

(10) Patent No.: US 9,383,418 B2
(45) Date of Patent: Jul. 5, 2016

(54) INTEGRATED DUAL AXIS FLUXGATE SENSOR USING DOUBLE DEPOSITION OF MAGNETIC MATERIAL

(71) Applicant: Texas Instruments Incorporated, Dallas, TX (US)

(72) Inventors: Anuraag Mohan, Fremont, CA (US); Dok Won Lee, Mountain View, CA (US); William French, San Jose, CA (US); Erika L. Mazotti, San Martin, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 153 days.

(21) Appl. No.: 14/286,517

(22) Filed: May 23, 2014

(65) Prior Publication Data
US 2015/0338474 A1    Nov. 26, 2015

(51) Int. Cl.
| | |
|---|---|
| *H01L 29/26* | (2006.01) |
| *G01R 33/09* | (2006.01) |
| *H01L 43/00* | (2006.01) |
| *H01L 43/12* | (2006.01) |
| *G01R 33/04* | (2006.01) |

(52) U.S. Cl.
CPC ............... *G01R 33/09* (2013.01); *G01R 33/04* (2013.01); *H01L 29/26* (2013.01); *H01L 43/00* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,815,220 B2 * | 11/2004 | Crawford | H01F 17/0006 257/E21.022 |
| 7,719,084 B2 | 5/2010 | Gardner et al. | |

OTHER PUBLICATIONS

"Integrated Inductors With Magnetic Materials for On-Chip Power Conversion," Circuits Research Lab & Future Technology Research, Intel Labs, Intel Corporation, pp. 1-36 (Donald S. Gardner).

* cited by examiner

*Primary Examiner* — Seahvosh Nikmanesh
(74) *Attorney, Agent, or Firm* — Jacqueline J. Garner; Frank D. Cimino

(57) ABSTRACT

A method of fabricating fluxgate devices to measure the magnetic field in two orthogonal, in plane directions, by using a composite-anisotropic magnetic core structure.

7 Claims, 6 Drawing Sheets

INTEGRATED DUAL AXIS FLUXGATE SENSOR USING DOUBLE DEPOSITION OF MAGNETIC MATERIAL

FIELD OF THE INVENTION

The present invention relates to fluxgates and, more particularly, to a semiconductor fluxgate sensor.

BACKGROUND OF THE INVENTION

A magnetic sensor is a device that measures the strength of an external magnetic field. There are a number of different approaches to measuring magnetic fields, and various different types of magnet sensors have been developed based on these different approaches. One type of magnetic sensor based on flux variations in a magnetic core is a fluxgate sensor.

FIG. 1 shows a block diagram that illustrates an example of a prior art fluxgate sensor 100. As shown in FIG. 1, fluxgate sensor 100 includes a drive coil 110, a sense coil 112, and a magnetic core structure 114 that lies within drive coil 110 and sense coil 112.

FIGS. 1A-1B show views that illustrate the operation of fluxgate magnetic sensor 100. FIG. 1A shows a graph that illustrates a BH curve 200 for magnetic core structure 114, while FIG. 1B shows a graph that illustrates the magnetic induction field B that results from the alternating current input to drive coil 110, FIG. 1B also shows a graph that illustrates an induced voltage in sense coil 112 plotted in the time domain that results from the magnetic induction field B, and FIG. 1C shows a graph that illustrates the induced voltage in sense coil 112 plotted in the frequency domain that results from the magnetic induction field B.

As shown by BH curve 200 in FIG. 1A, when the magnitude of a magnetic field H increases, magnetic core structure 114 increases the magnitude of the magnetic induction field B until magnetic core structure 114 saturates. Once in saturation, further increases in the magnitude of the magnetic field H lead to very little increase in the magnitude of the magnetic induction field B. As a result, saturation is commonly illustrated as in FIG. 1A as the region where increases in the magnitude of the magnetic field H lead to no additional increase in the magnitude of the magnetic induction field B.

In the present example, the magnitude of the magnetic field H is increased by increasing the magnitude of the alternating current flowing through drive coil 110.

As shown in FIGS. 1A-1B, when no external magnetic field is present and an alternating current waveform, which has an amplitude that is sufficient to drive magnetic core structure 114 into saturation, is input to the drive coil 110, an alternating magnetic induction field B, is generated in response. In other words, when alternating current waveform is input to drive coil 110, magnetic core structure 114 is driven through cycles (magnetized, un-magnetized, inversely magnetized, un-magnetized, magnetized again, and so on) that generate an alternating magnetic induction field B. In the present example, the alternating current waveform on coil 110 is triangular, while the magnetic induction waveform on coil 112 has flat tops and bottoms that represent the periods of saturation.

As a consequence the alternating magnetic induction field B induces an alternating voltage in sense coil 112. The induced alternating voltage is proportional to the change in the magnetic induction field B over time (dB/dt).

As shown in FIG. C, in the frequency domain, the induced alternating voltage has a fundamental frequency $1f$, hut only odd harmonics, such as a third harmonic $3f$, of the fundamental frequency $1f$.

As a result, when no external magnetic field is present, the induced alternating voltage has no second harmonic. However, when an external magnetic field is present, the external magnetic field interacts with magnetic core structure 114 and changes the alternating magnetic induction field B. In other words, magnetic core structure 114 is more easily saturated when magnetic core structure 114 is in alignment with the external magnetic field, and less easily saturated when magnetic core structure 114 is in opposition to the external magnetic field.

Magnetic films used in the fluxgate devices have the directional dependence at the operation frequency of interest (MHz range). In general the direction corresponding to the hard axis of the magnetic core is utilized to measure the magnetic field. This is fine for measuring the magnetic field in one specific direction, but this makes it difficult to measure the in-plane magnetic field, which is essential for e-compass applications. This is due to the different mechanisms involved for the magnetization process along the easy- and hard-axis directions i.e. two orthogonal in-plane directions in magnetic films). The main mechanism along the easy-axis is the magnetic domain displacement, where that along the hard-axis is the spin rotation. While the magnetization response along the hard-axis is stable over a wide range of frequency, that along the easy-axis shows a strong frequency dependence with the decreased response at MHz range. So the hard-axis direction is being utilized for the fluxgate applications. Thus, there is a need for a smaller and less expensive fluxgate magnetic sensor. A method needs to be developed that minimizes the directional dependence of magnetic sensor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, an integrated Dual Axis Fluxgate Sensor, the Integrated Dual Axis Fluxgate Sensor, comprises: a processed semiconductor wafer having a planar top surface including a first SiN layer on the top surface; a first TEOS layer configured to define a form for a bottom layer of a coil; a first copper conductor layer deposited in the TEOS form thereby forming the bottom layer of the a coil; a second layer overlaying the top surface of the first TEOS layer and the top surface of the first copper conductor layer forming the bottom layer of the coil; a second TEOS layer overlaying and touching the top surface of the second SiN layer and a third SiN layer overlaying the second TEOS layer; a of titanium layer overlaying and touching the top surface of the third SiN layer; a laminated magnetic core structure selected from a group of a first magnetic lamination method or a second magnetic lamination method; a third TEOS layer overlying the third SiN layer, the bottom layer of the coil and the top surface of the laminated magnetic core structure, wherein the second TEOS layer is configured to define a form for a plurality of openings touching the bottom layer of the coil; a second copper conductor layer deposited in the plurality of openings forming vias touching and coupling to the bottom layer of the coil; a third copper layer defined to form the top layer of the coil wherein the third copper layer connects to the vias thereby coupling the top layer of the coil to the bottom layer of the coil; and a passivation layer touching the top surface of the third TEOS layer and the top surface of the top layer of coil, wherein the passivation layer included openings in the passivation layer to contact the top layer of the coil.

In accordance with another embodiment of the present application, a method of forming an Integrated Dual Axis Fluxgate Sensor, the method of forming an Integrated Dual Axis Fluxgate Sensor, comprises: providing a processed semiconductor wafer that has been CMP'd and has an etch stop first SiN layer deposited on the surface; depositing and defining a first TEOS layer to define a form for a bottom layer of a coil; depositing a Ti/Cu seed layer on the first TEOS layer, wherein a first copper conductor layer is then electroplated on the top surface of the seed layer; CMP polishing the top surface of the wafer to remove the excess copper not filling the form; known as a damascene process; depositing a second SiN layer and then a second TEOS layer, in sequence, on the top surface of the first TEOS layer and the top surface of the copper bottom layer of the coil; depositing a third SiN layer on the top surface of the second TEOS layer and finally a of titanium layer on the top surface of the third SiN layer; depositing a laminated magnetic core structure selected from a group of a first magnetic lamination method or a second magnetic lamination method; depositing and patterning photoresist and then etching the magnetic core structure of alternating layers of NiFe and AlN dielectric layers stopping on the titanium layer and then etching the titanium layer exposed by the magnetic core etch; depositing a third TEOS layer the top surface of the magnetic core stack and the top surface of the third SiN layer, wherein the third TEOS layer is configure to included a plurality of openings terminating on the bottom layer of the coil; electroplating a second layer of copper to form copper vias through the openings in the third TEOS layer, wherein the copper vias couple with the bottom layer of the coil; CMP polishing t e top surface of the wafer to remove the excess copper not filling the openings in the third TEOS layer, known as a damascene process; depositing and defining a fourth TEOS layer to define a form for a top layer of the coil; electroplating a third copper layer over the fourth TEOS layer, CMP polishing the top surface of the wafer to remove the excess copper not the openings in the fourth TEOS layer, known as a damascene process, wherein the third copper layer connects to the vias thereby coupling the top layer of the coil to the bottom layer of the coil; and depositing passivation layers touching the top surface of the fourth TEOS layer and the top surface of the top layer of coil, wherein openings are included in the passivation layers to contact the top copper layer.

DESCRIPTION OF THE VIEWS OF THE DRAWING

In the drawings, like reference numerals are sometimes used to designate like structural elements, it should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Magnetic cores having hard-axis properties in two orthogonal, in-plane directions are desirable for the fluxgate applications. This can be achieved by forming a composite-anisotropy structure. Magnetic cores for the fluxgates use the laminated structure with alternating magnetic and insulating layers to improve the fluxgate performance. While depositing the magnetic layers, some layers can be aligned differently from the rest of magnetic layers such that their hard-axis direction is orthogonal to that of the rest of magnetic layers. By doing so, fluxgates in two orthogonal in-plane directions can have some magnetic layers having the hard-axis properties in the measurement direction.

Use of the composite-anisotropy magnetic core enables the wafer-level fabrication of fluxgates capable of measuring the magnetic field in two orthogonal, in-plane directions. This removes the need for the packaging-level integration and can reduce the cost.

Use of the closed magnetic core with the composite-anisotropy structure, can improve the magnetic flux closure. This leads to the increase in the effective permeability and hence the fluxgate sensitivity. In addition, this can reduce the current needed to saturate the magnetic core and hence the power consumption.

Fabricating a core, using double deposition, enables magnetic cores to have hard axes along orthogonal axes and can be used to form fluxgates with closed cores and enable monolithic integration of XY axis sensors.

Figure 1:
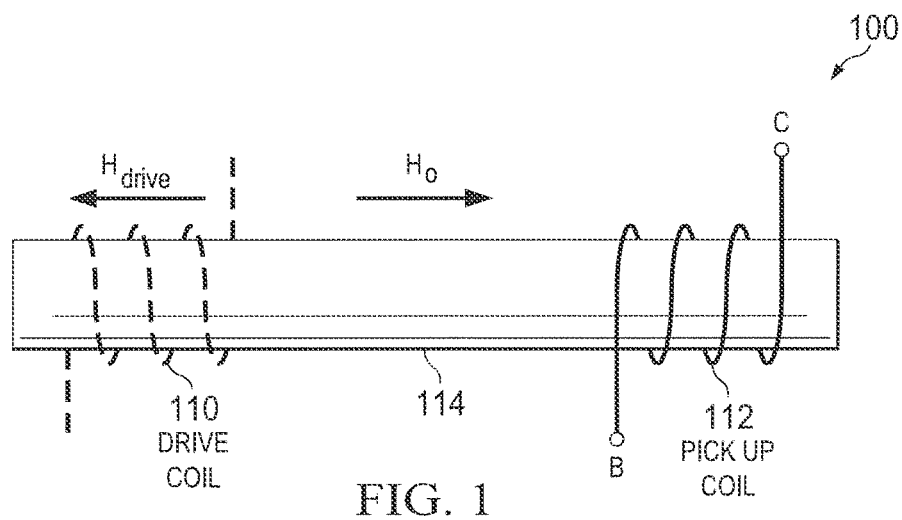
FIG. 1 shows a block diagram that illustrates an example of a prior art fluxgate sensor (Prior Art).
Figure 1A:
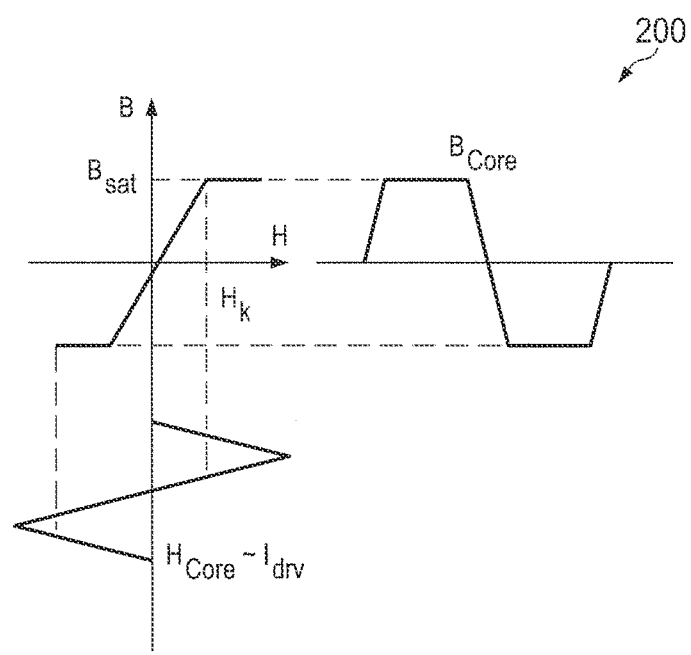
FIG. 1A shows a graph that illustrates a BH curve for the magnetic core structure shown in FIG. 1 (Prior Art).
Figure 1B:
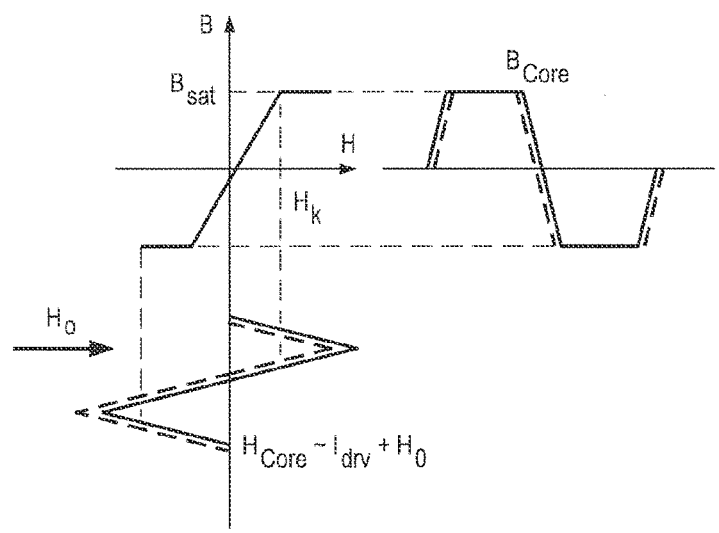
FIG. 1B shows a graph that illustrates an induced voltage in the sense coil plotted in the time domain that results from the magnetic induction field B (Prior Art).
Figure 1C:
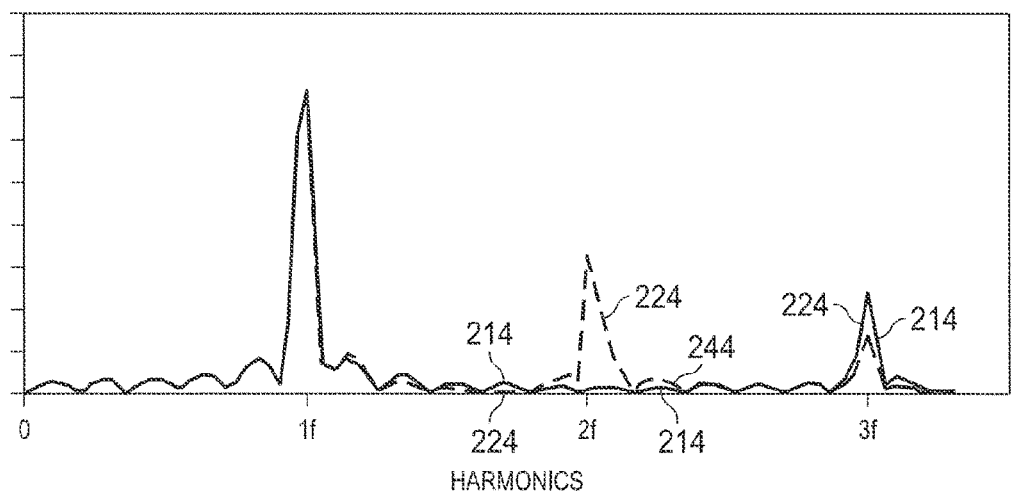
FIG. 1C shows a graph that illustrates the induced voltage in sense coil plotted in the frequency domain that results from the magnetic induction field B (Prior Art).
Figure 2:
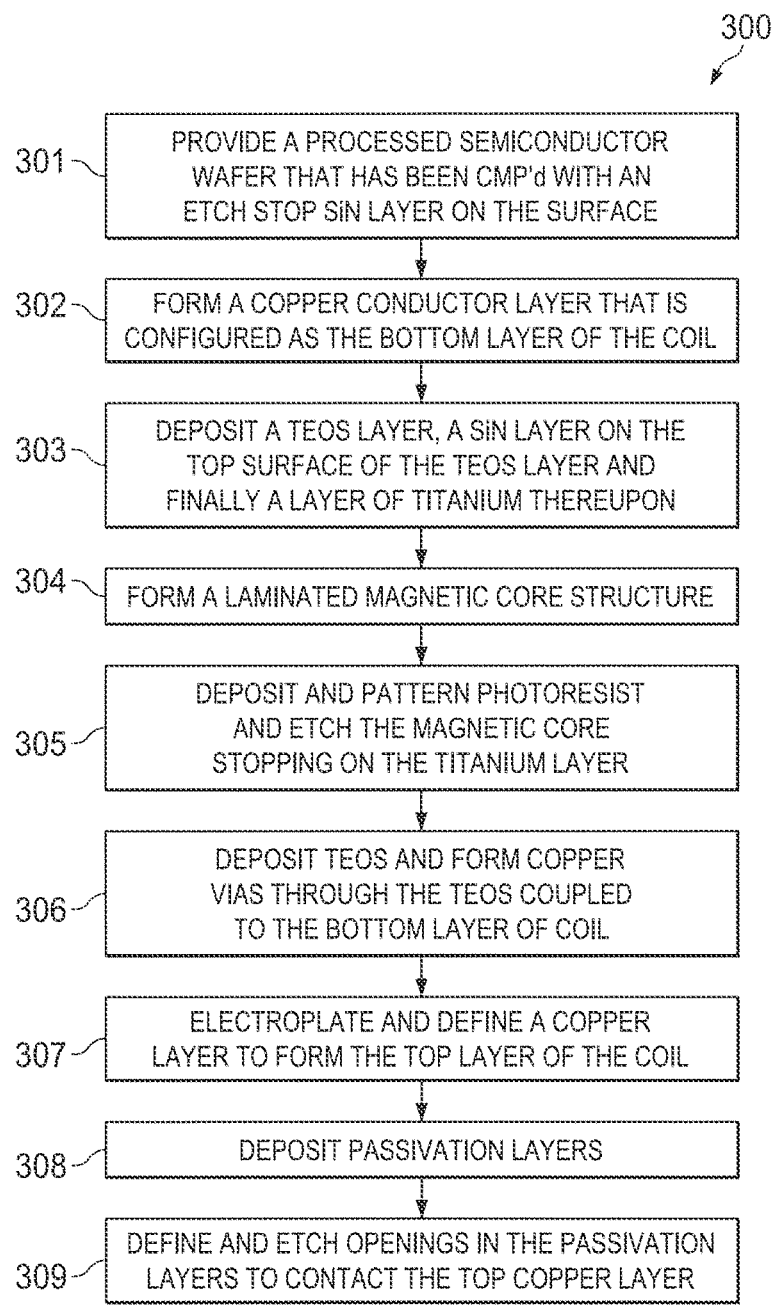
FIG. 2 is a process flow chart for fabricating composite-anisotropy magnetic cores on a standard process integrated circuit wafer

In practice, a magnetic core with orthogonal axes is can be formed in the sequence 300 shown in FIG. 2.

Step 301 is to provide a processed semiconductor wafer that has been CMP'd with an etch stop SiN layer on die surface.

Step 302 is to deposit and define TEOS layer to define a form for a bottom layer of a coil. A Ti/Cu seed layer is then deposited on the TEOS layer. A first copper conductor layer is then electroplated (4-7 μm) on the top surface of the seed layer. A CMP polish process is then provided to remove the excess copper not filling the form (damascene process).

Step 303 is to deposit a SiN layer and then a TEOS layer on the top surface of the TEOS layer formed in step 302 and the top surface of the copper bottom layer of coil formed in step 302, a SiN layer is the deposited on the top surface of the TEOS layer and finally a of titanium layer on the top surface of the SiN layer.

Step 304 is to form a laminated magnetic core structure selected from a group of a first magnetic lamination method or a second magnetic lamination method.

The first magnetic lamination method comprising;
depositing a first stack of alternating 300 nm layers of NiFe and AlN dielectric layers on the top surface of the titanium formed in step 303 wherein the NiFe layers are aligned in a North-South direction;
depositing a layer of MA on the top surface of the first stack of alternating layers of NiFe and AlN dielectric;
depositing a second stack of alternating 300 nm layers of NiFe and AlN dielectric layers on the top surface of the AlN wherein, the NiFe layers are aligned in an East-West direction.

The second magnetic lamination method comprising;
depositing alternating 300 nm layers of NiFe and AlN dielectric layers on the top surface of the titanium layer formed in step 303 wherein, the odd numbered NiFe layers can be aligned in a North-South direction and the even numbered NiFe layers can be aligned in an East-West direction.

Step 305 is to deposit and pattern photoresist and then etch the magnetic core of alternating layers of NiFe and AlN dielectric layers formed in step 304 stopping on the titanium layer formed in step 303 and then etching the titanium layer exposed by the magnetic core etch.

Step 306 is to deposit TEOS on the top surface of the magnetic core stack and the top surface of the SiN formed in step 303, wherein the TEOS is configure to included a plurality of openings terminating on the bottom layer of coil and electroplating a second layer of copper to form copper vias (process similar to damascene steps in step 302) through the openings in the TEOS coupled to the bottom layer of coil formed in step 302.

Step 307 is to electroplate (process similar to damascene steps in step 302) and define a third copper layer to form the top layer of the coil wherein the third copper layer connects to the vias formed in step 308 thereby coupling the top layer of the coil to the bottom layer of the coil.

Step 308 is to deposit passivation layers touching the top surface of the TEOS formed in step 306 and the top surface of the top layer of coil formed in step 307

Step 309 is to define and etch openings in the passivation layers to contact the top copper layer.

Figure 3A:
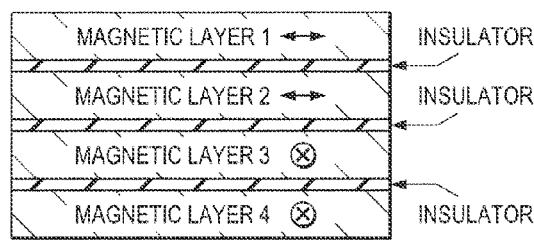
FIG. 3A illustrates a cross section of the magnetic core indicating hard axis directions in one embodiment of the invention.

FIG. 3A illustrates a cross section o the magnetic core formed using the first magnetic lamination method, indicating hard axis directions.

Figure 3B:
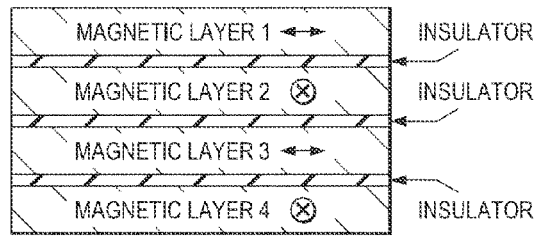
FIG. 3B illustrates a cross section of the magnetic core indicating hard axis directions in another embodiment of the invention.

FIG. 3B illustrates a cross section o the magnetic core formed using the second magnetic lamination method, indicating hard axis directions.

Figure 4C:
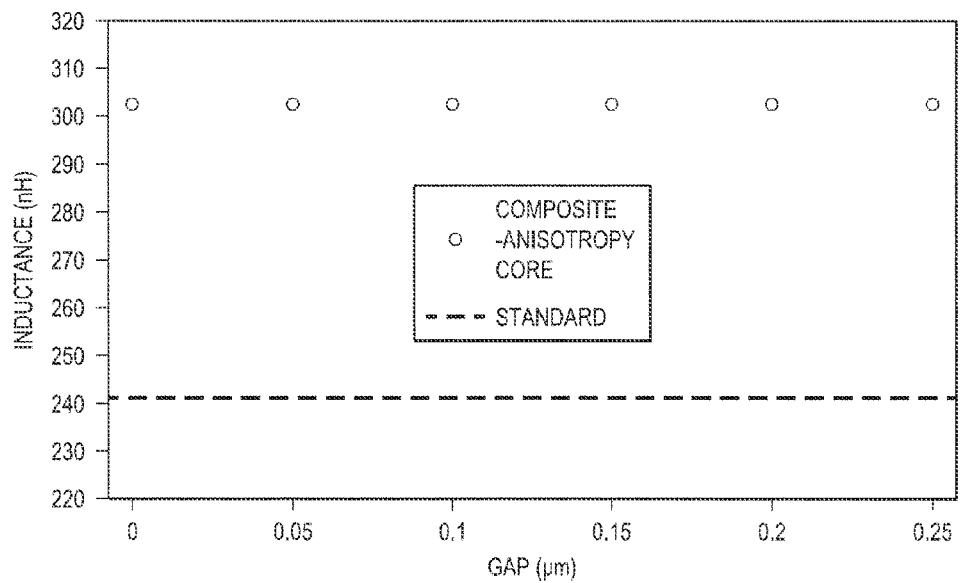
FIG. 4C is a graph illustrating inductance vs gap size in μms for a standard core vs a composite-anisotropic core.
Figure 4A:
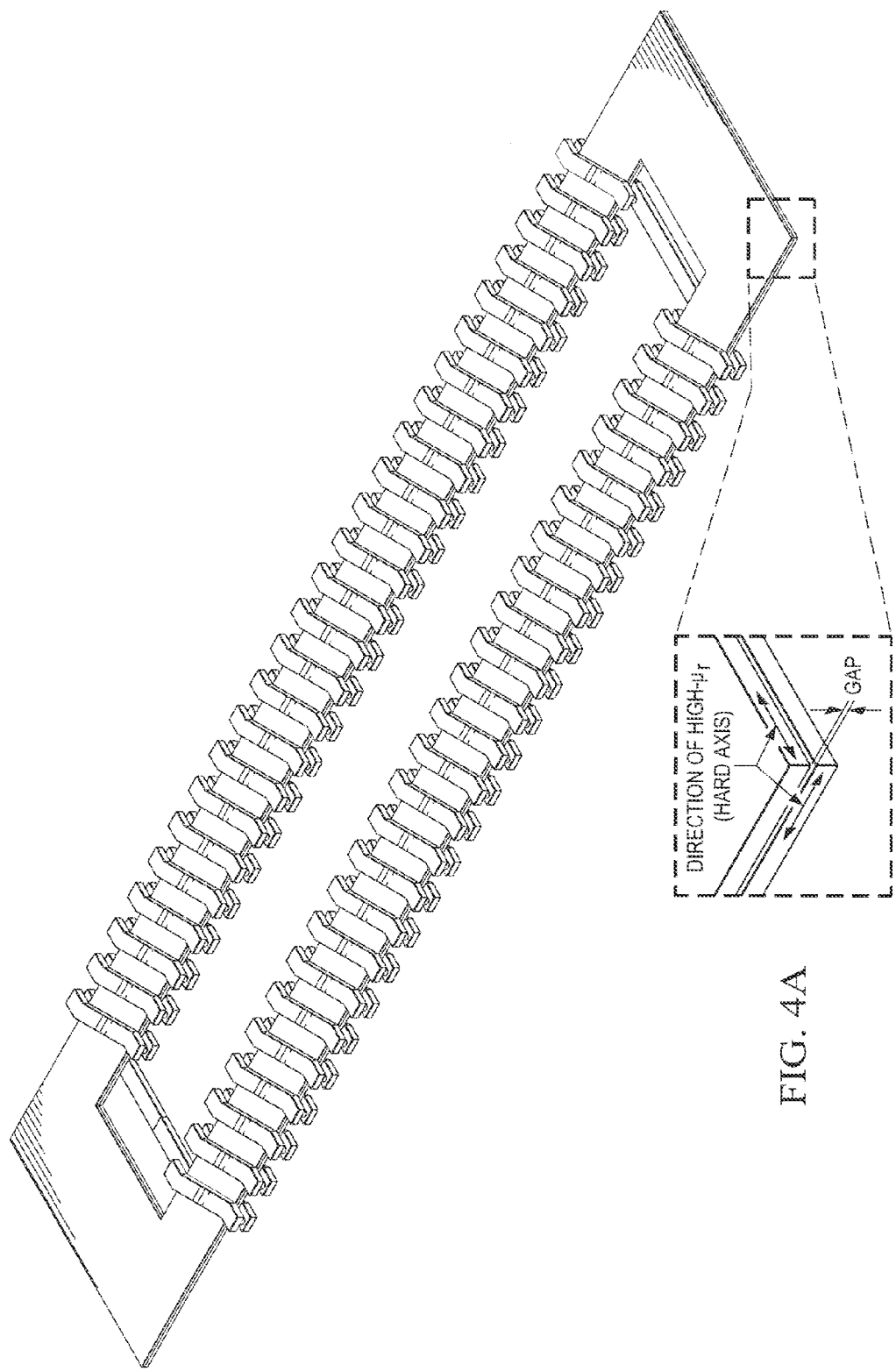
FIG. 4A illustrates a fluxgate with a "race-track type magnetic core, detailing the directions of the hard axis's and the gap in the core.

FIG. 4A illustrates a fluxgate with a "race-track type magnetic core, detailing the directions of the hard axis's and the gap in the core.

Figure 4B:
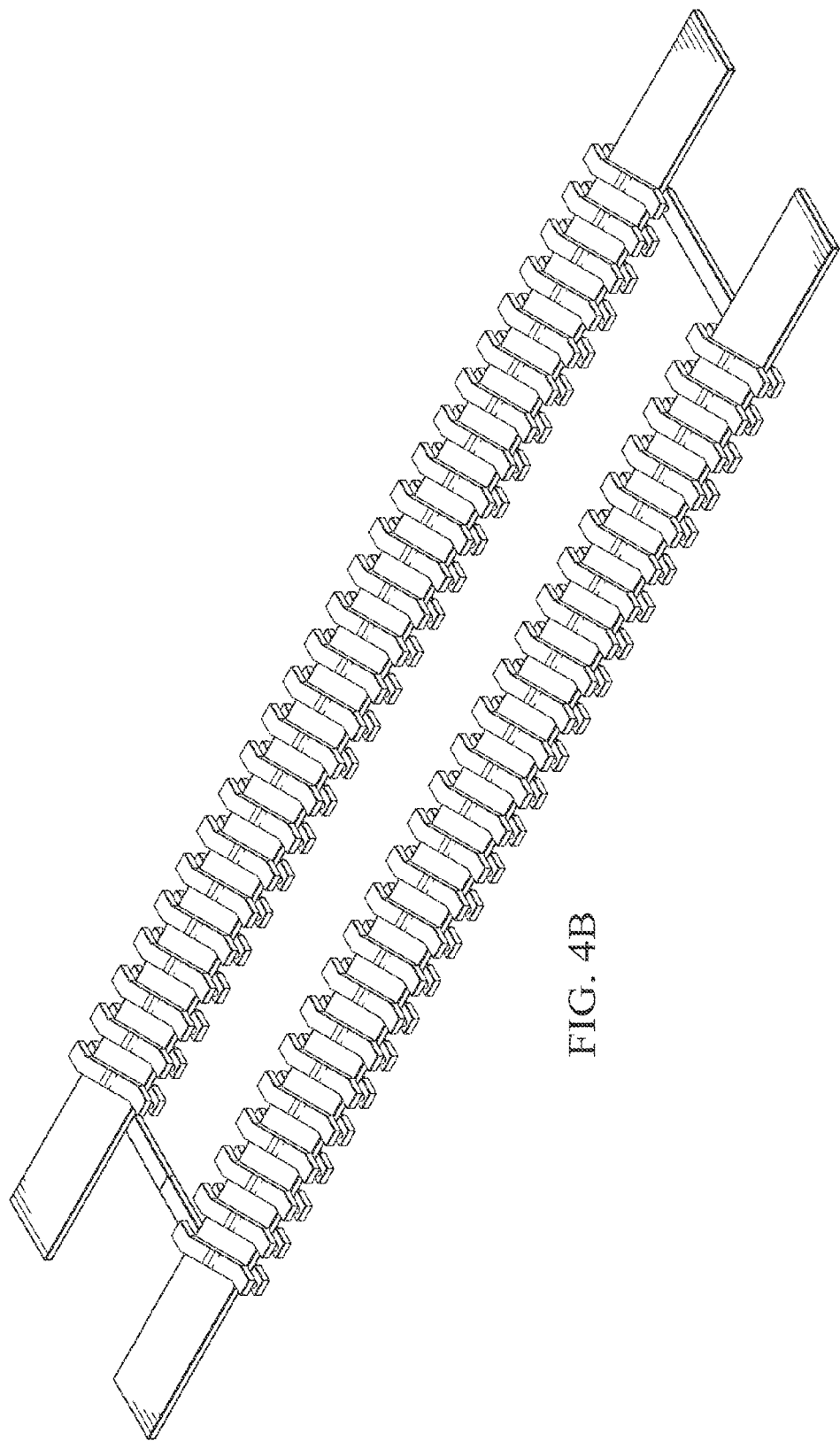
FIG. 4B illustrates a fluxgate with a standard open core.

FIG. 4B illustrates a fluxgate with a standard open core.

FIG. 4C illustrates inductance vs gap size in μms for a standard core vs a composite-anisotropic core. It is readily apparent, that composite cores offer much higher inductance per unit area than standard core implementations.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an Integrated Dual Axis Fluxgate Sensor, comprising:
providing a processed semiconductor wafer that has been chemical mechanical polished (CMP'd) and has an etch stop first SiN layer deposited on the surface;
depositing and defining a first TetraEthyl OrthoSilicate (TEOS) layer to define a form for a bottom layer of a coil;
depositing a Ti/Cu seed layer on the first TEOS layer, wherein a first copper conductor layer is then electroplated on the top surface of the seed layer;
chemical mechanical planarization (CMP) polishing the top surface of the wafer to remove the excess copper not filling the form, known as a damascene process;
depositing a second SiN layer and then a second TEOS layer, in sequence, on the top surface of the first TEOS layer and the top surface of the copper bottom layer of the coil;
depositing a third SiN layer on the top surface of the second TEOS layer and finally a titanium layer on the top surface of the third SiN layer;
depositing a laminated magnetic core structure selected from a group of a first magnetic lamination method or a second magnetic lamination method;
depositing and patterning photoresist and then etching the magnetic core structure of alternating layers of NiFe and AlN dielectric layers stopping on the titanium layer and then etching the titanium layer exposed by the magnetic core etch;
depositing a third TEOS layer the top surface of the magnetic core stack structure and the top surface of the third SiN layer, wherein the third TEOS layer is configure to included a plurality of openings terminating on the bottom layer of the coil;
electroplating a second layer of copper to form copper vias through the openings in the third TEOS layer, wherein the copper vias couple with the bottom layer of the coil;
CMP polishing the top surface of the wafer to remove the excess copper not filling the openings in the third TEOS layer, known as a damascene process;
depositing and defining a fourth TEOS layer to define a form for a top layer of the coil;
electroplating a third copper layer over the fourth TEOS layer, CMP polishing the top surface of the wafer to remove the excess copper not filling the openings in the fourth TEOS layer, known as a damascene process, wherein the third copper layer connects to the vias thereby coupling the top layer of the coil to the bottom layer of the coil; and depositing passivation layers touching the top surface of the fourth TEOS layer and the top surface of the top layer of coil, wherein openings are included in the passivation layers to contact the top copper layer.

2. The method of forming an Integrated Dual Axis Fluxgate Sensor of claim 1, wherein the first magnetic lamination method comprises:

depositing alternating layers of NiFe and AlN dielectric layers on the top surface of the titanium layer formed on the third SiN layer wherein, the NiFe layers are aligned in a North-South direction;

depositing an AlN layer on the top surface of the stack of alternating layers of NiFe and AlN dielectric; and depositing alternating layers of NiFe and AlN dielectric layers on the top surface of the AlN wherein, the NiFe layers are aligned in an East-West direction.

3. The method of forming an Integrated Dual Axis Fluxgate Sensor of claim 1, wherein the second magnetic lamination method comprises:

depositing a stack of alternating 300nm layers of NiFe and AlN dielectric layers on the top surface of the titanium layer, wherein the odd numbered NiFe layers are aligned in a North-South direction and the even numbered NiFe layers are aligned in an East-West direction.

4. The method of forming an Integrated Dual Axis Fluxgate Sensor of claim 1, wherein the NiFe layer has a thickness of 300nm.

5. The method of forming an Integrated Dual Axis Fluxgate Sensor of claim 1, wherein the magnetic core is implemented in a race track configuration.

6. The method of forming an Integrated Dual Axis Fluxgate Sensor of claim 1, wherein the magnetic core is implemented in a standard open core configuration.

7. The method of forming an Integrated Dual Axis Fluxgate sensor of claim 1, wherein the first copper conductor layer has a thickness of 4- 7μm.

* * * * *